(12) United States Patent
Hishiki

(10) Patent No.: US 10,934,483 B2
(45) Date of Patent: Mar. 2, 2021

(54) FINE FLUORESCENT-MATERIAL PARTICLES, PROCESS FOR PRODUCING FINE FLUORESCENT-MATERIAL PARTICLES, THIN FLUORESCENT-MATERIAL FILM, WAVELENGTH CONVERSION FILM, WAVELENGTH CONVERSION DEVICE, AND SOLAR CELL

(71) Applicant: NGK Insulators, Ltd., Nagoya (JP)

(72) Inventor: Tatsuya Hishiki, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 404 days.

(21) Appl. No.: 15/884,643

(22) Filed: Jan. 31, 2018

(65) Prior Publication Data

US 2018/0148643 A1 May 31, 2018

Related U.S. Application Data

(63) Continuation of application No. PCT/JP2016/068071, filed on Jun. 17, 2016.

(30) Foreign Application Priority Data

Aug. 4, 2015 (JP) .............................. JP2015-153966
Oct. 1, 2015 (JP) .............................. JP2015-195953

(51) Int. Cl.
*C09K 11/66* (2006.01)
*H01L 31/055* (2014.01)
(Continued)

(52) U.S. Cl.
CPC ............ *C09K 11/663* (2013.01); *C01G 19/00* (2013.01); *C01G 19/006* (2013.01);
(Continued)

(58) Field of Classification Search
CPC ..................................................... C09K 11/663
See application file for complete search history.

(56) References Cited

U.S. PATENT DOCUMENTS

2011/0101272 A1 5/2011 Im et al.
2012/0068213 A1 3/2012 Zhang et al.

FOREIGN PATENT DOCUMENTS

JP 2003-218379 A1 7/2003
JP 3698215 B2 9/2005
(Continued)

OTHER PUBLICATIONS

Doroftei et al, "Preparation and study of structural propeties of zinc-doped barium stannate", Journal of Optoelectronics and Advanced Materials, vol. 14, #3-4, Apr. 30, 2012, pp. 413-417.*
(Continued)

*Primary Examiner* — C Melissa Koslow
(74) *Attorney, Agent, or Firm* — Burr & Brown, PLLC

(57) ABSTRACT

A luminescent substance particle includes $BaSnO_3$:Zn having a perovskite-type structure, a content of Zn (zinc) being more than 0.0% by mass and less than 8.0% by mass. Alternatively, a luminescent substance particle includes $BaSnO_3$:Mg having a perovskite-type structure, a content of Mg (magnesium) being more than 0.0% by mass and less than 0.1% by mass.

7 Claims, 12 Drawing Sheets

(51) Int. Cl.
*C01G 19/00* (2006.01)
*C04B 35/453* (2006.01)
*C04B 35/457* (2006.01)
*C09K 11/55* (2006.01)

(52) U.S. Cl.
CPC .......... *C04B 35/453* (2013.01); *C04B 35/457* (2013.01); *C09K 11/55* (2013.01); *C09K 11/66* (2013.01); *H01L 31/055* (2013.01); *C01P 2002/34* (2013.01); *C01P 2002/54* (2013.01); *C01P 2002/72* (2013.01); *C01P 2004/04* (2013.01); *C01P 2004/64* (2013.01); *C04B 2235/3215* (2013.01); *C04B 2235/3284* (2013.01); *C04B 2235/768* (2013.01); *Y02E 10/52* (2013.01)

(56) References Cited

FOREIGN PATENT DOCUMENTS

| | | | |
|---|---|---|---|
| JP | 2007-146102 | * | 6/2007 |
| JP | 2007-146102 A1 | | 6/2007 |
| JP | 2012-067167 A1 | | 4/2012 |
| JP | 2013-004806 A1 | | 1/2013 |
| WO | 2009/002943 A2 | | 12/2008 |
| WO | WO 2015/016399 | * | 2/2015 |

OTHER PUBLICATIONS

Translation of WO 2015/016399, Feb. 5, 2015.*
Extended European Search Report, European Application No. 16832623.9, dated Mar. 26, 2019 (9 pages).
Doroftei, c., et al. "Preparation and study of structural properties of zinc-doped barium stannate," *Journal of Optoelectronics and Advanced Materials*, vol. 14, No. 3-4, dated Apr. 30, 2012, XP002789751 (pp. 413-417).
Wang, W., et al. "Microwave hydrothermal synthesis of $MSnO_3$ ($M^{2+}=Ca^{2+}$, $Sr^{2+}$, $Ba^{2+}$): effect of $M^{2+}$ on crystal structure and photocatalytic properties," *Journal of Materials Science*, vol. 49, No. 4, dated Dec. 3, 2013, XP055475148, Dordrecht ISSN: 0022-2461, DOI: 10.1007/s10853-013-7880-x (pp. 1893-1902).
Hiroshi Mizoguchi, et al., "Strong Near-Infrared Luminescence in $BaSnO_3$," Journal of American Chemical Society, 2004, 126, pp. 9796-9800.
Yosuke Ohya, et al., "*Influence of Composition in Near-Infrared Luminescence of $BaSn_xO_3$,*" Proceedings of Annual Meeting of the Ceramic Society of Japan, published Mar. 7, 2014, Abstract 3L10 (with partial English translation).
International Search Report and Written Opinion (Application No. PCT/JP2016/068071) dated Aug. 2, 2016.

* cited by examiner

FINE FLUORESCENT-MATERIAL PARTICLES, PROCESS FOR PRODUCING FINE FLUORESCENT-MATERIAL PARTICLES, THIN FLUORESCENT-MATERIAL FILM, WAVELENGTH CONVERSION FILM, WAVELENGTH CONVERSION DEVICE, AND SOLAR CELL

CROSS-REFERENCE TO RELATED APPLICATIONS

This application is a Continuation of International Application No. PCT/JP2016/068071 filed on Jun. 17, 2016, which is based upon and claims the benefit of priority from Japanese Patent Applications No. 2015-153966 filed on Aug. 4, 2015 and No. 2015-195953 filed on Oct. 1, 2015, the contents all of which are incorporated herein by reference.

BACKGROUND OF THE INVENTION

Field of the Invention

The present invention relates to a luminescent substance particle (fine fluorescent-material particles) of a perovskite-type oxide and a method for producing the luminescent substance particle (process for producing fine fluorescent-material particles), and relates to a luminescent substance film (thin fluorescent-material film), a wavelength conversion film, a wavelength conversion device, and a solar battery (solar cell) using the luminescent substance particle.

Background Art

Japanese Patent No. 3698215 discloses a basic concept that in order to improve power generation efficiency of a solar battery, a part of a solar light is wavelength-converted to generate a light with a longer wavelength, at which the solar battery has a higher spectral sensitivity.

PRIOR ART DOCUMENTS

Non-Patent Documents

Non-Patent Document 1 and Japanese Laid-Open Patent Publication No. 2007-146102 disclose a material having a wavelength conversion function, and Japanese Laid-Open Patent Publication No. 2013-004806 discloses a solar battery having a wavelength conversion layer. Furthermore, Non-Patent Document 2 discloses an effect of a feed composition on a light emission property of $BaSnO_3$.

Non-Patent Document 1: Hiroshi Mizoguchi, Patrick M. Woodward, Cheol-Hee Park, and Douglas A. Keszler, "Strong Near-Infrared Luminescence in $BaSnO_3$", J. Am. Chem. Soc., 2004, 126, 9796-9800

Non-Patent Document 2: Yosuke Ohya, Yuichiro Kuroki, Tomoichiro Okamoto, and Masasuke Takata, "Influence of Composition in Near-infrared Luminescence of $BaSn_xO_3$", Abstract 3L10, Annual Meeting 2014, The Ceramic Society of Japan Specifically, Japanese Patent No. 3698215 focuses on a photoactivation property of a rare-earth ion, and teaches a concept that a light energy is wavelength-converted and then transmitted to a photoelectric conversion portion to achieve a solar battery light-receiving element with a high efficiency. This document describes an example of using a rare-earth metal of Eu (europium) or Ce (cerium) in a wavelength conversion material to convert a solar light with a peak wavelength of 370 nm to a light with a peak wavelength of about 410 nm.

Non-Patent Document 1 discloses that $BaSnO_3$ exhibits an emission spectrum of about 800 to 1100 nm under an excitation spectrum of 300 to 400 nm. This document discloses a method containing preparing $BaSn(OH)_6$ via a hydrothermal synthesis and thermally decomposing the $BaSn(OH)_6$ to obtain the $BaSnO_3$. This document is silent about the particle diameter of the $BaSnO_3$, but discloses a crystallite size of 100 to 350 nm. Furthermore, this document discloses that there is no relationship between the particle diameter and light emission intensity.

Japanese Laid-Open Patent Publication No. 2007-146102 describes a luminescent substance of an inorganic oxide prepared by doping a matrix with a rare-earth element and/or a transition metal element. The matrix is composed of an oxide of an alkaline-earth metal and Sn, represented by $ASnO_3$ or $A_{n+1}Sn_nO_{3n+1}$ (wherein A is one, two, or more alkaline-earth metal elements selected from the group consisting of Mg, Ca, Sr, and Ba, and n is 1 or 2). This document discloses a general idea that a luminescent substance is used in a photoelectric conversion element, a photoelectric conversion device, or the like. This document does not disclose data pertaining to wavelength conversion of $BaSnO_3$, or the shape and particle diameter of the $BaSnO_3$. This document discloses a solid-phase reaction (a method containing burning a raw material mixture) as a production method.

Japanese Laid-Open Patent Publication No. 2013-004806 discloses a solar battery having a surface protective layer as the outermost layer, a wavelength conversion layer, and a sealant resin layer, formed on the light-receiving surface of each cell of the battery. The surface protective layer transmits a light in a short wavelength region of 350 nm or less. The wavelength conversion layer is disposed just below the surface protective layer. The wavelength conversion layer contains a wavelength conversion material, which absorbs a light in the short wavelength region of 350 nm or less and has a light emission wavelength in a longer wavelength region.

Non-Patent Document 2 discloses that the luminescence of the $BaSn_xO_3$ (0.8×1.6) exhibits a peak at the near-infrared region wavelength of 890 nm, and exhibits the maximum light emission intensity when the feed composition ratio x of Sn to Ba is 1.3.

SUMMARY OF THE INVENTION

However, the materials of Japanese Patent No. 3698215 and Japanese Laid-Open Patent Publication No. 2007-146102 contain a rare-earth element, and therefore result in high production costs disadvantageously.

The wavelength conversion layer of Japanese Laid-Open Patent Publication No. 2013-004806 contains an organic material. Therefore, the position of the wavelength conversion layer is limited. For example, the wavelength conversion layer cannot be formed on the outermost surface of the solar battery.

Japanese Patent No. 3698215, Japanese Laid-Open Patent Publication No. 2007-146102, and Non-Patent Documents 1 and 2 do not disclose internal quantum efficiencies. Therefore, the property changes of the photoelectric conversion elements and the like cannot be evaluated objectively.

In view of the above problems, an object of the present invention is to provide a luminescent substance particle and a production method thereof that can achieve an increased wavelength shift amount, an improved transparency, an improved internal quantum efficiency, an improved power generation efficiency of a solar battery or the like, and a reduced production cost.

Another object of the present invention is to provide a luminescent substance film, a wavelength conversion film, and a wavelength conversion device that can achieve an increased wavelength shift amount, an improved transparency, an improved power generation efficiency of a solar battery or the like, and a reduced production cost.

A further object of the present invention is to provide a solar battery that uses the luminescent substance particle, the wavelength conversion film, or the wavelength conversion device, whereby the power generation efficiency can be improved, and the mounting position of the wavelength conversion film or a component having a wavelength conversion function can be arbitrarily selected, and thus the design flexibility can be improved.

[1] According to a first aspect of the present invention, there is provided a luminescent substance particle including $BaSnO_3$:Zn (Zn-doped $BaSnO_3$) having a perovskite-type structure, wherein a content of Zn (zinc) is more than 0.0% by mass and less than 8.0% by mass.

[2] According to a second aspect of the present invention, there is provided a luminescent substance particle including $BaSnO_3$:Mg (Mg-doped $BaSnO_3$) having a perovskite-type structure, wherein a content of Mg (magnesium) is more than 0.0% by mass and less than 0.1% by mass.

[3] The luminescent substance particle may have a particle diameter of 100 nm or less.

[4] According to a third aspect of the present invention, there is provided a method for producing a luminescent substance particle including $BaSnO_3$:Zn having a perovskite-type structure. The method includes a reaction step of carrying out a reaction of a Ba (barium) source, a Sn (stannum) source, and a Zn (zinc) source to obtain the luminescent substance particle. In the method, the amounts of Ba, Sn, and Zn are controlled in a manner that the amounts of Sn and Ba are equivalent to each other by mole and the amount of Zn is more than 0.000% by mole and less than 40.262% by mole per 100% by mole of Sn in the Sn source.

[5] According to a fourth aspect of the present invention, there is provided a method for producing a luminescent substance particle including $BaSnO_3$:Mg having a perovskite-type structure. The method includes a reaction step of carrying out a reaction of a Ba (barium) source, a Sn (stannum) source, and a Mg (magnesium) source to obtain the luminescent substance particle. In the method, the amounts of Ba, Sn, and Mg are controlled in a manner that the amounts of Sn and Ba are equivalent to each other by mole and the amount of Mg is more than 0.000% by mole and less than 1.198% by mole per 100% by mole of Sn in the Sn source.

[6] In the third and fourth aspects, a plasma synthesis process is preferably performed in the reaction step.

[7] In the third and fourth aspects, a microwave hydrothermal synthesis process is preferably performed in the reaction step.

[8] In the third and fourth aspects, a supercritical hydrothermal synthesis process using a titanium alloy container is preferably performed in the reaction step.

[9] In the third and fourth aspects, a spray pyrolysis synthesis process is preferably performed in the reaction step.

[10] According to a fifth aspect of the present invention, there is provided a luminescent substance film including the luminescent substance particle of the first or second aspect or the luminescent substance particle produced by the method of the third or fourth aspect.

[11] According to a sixth aspect of the present invention, there is provided a wavelength conversion film for converting a light in an ultraviolet region to a light in an infrared region, including the luminescent substance particle of the first or second aspect or the luminescent substance particle produced by the method of the third or fourth aspect.

[12] According to a seventh aspect of the present invention, there is provided a wavelength conversion film obtained by dispersing the luminescent substance particle of the first or second aspect or the luminescent substance particle produced by the method of the third or fourth aspect in a liquid phase, and then applying the liquid phase.

[13] In this case, the liquid phase may contain a compound for forming a siloxane bond, and may be hardened while incorporating the luminescent substance particle therein.

[14] According to an eighth aspect of the present invention, there is provided a wavelength conversion device including a substrate and the wavelength conversion film of the sixth or seventh aspect formed on the substrate.

[15] In this case, the substrate may be a flexible resin sheet or a composite sheet containing a resin and an inorganic material.

[16] According to a ninth aspect of the present invention, there is provided a solar battery including, in at least one component of the solar battery, the luminescent substance particle of the first or second aspect or the luminescent substance particle produced by the method of the third or fourth aspect.

[17] According to a tenth aspect of the present invention, there is provided a solar battery including the wavelength conversion film of the sixth or seventh aspect formed on a front surface or a rear surface of at least one component of the solar battery.

[18] According to an eleventh aspect of the present invention, there is provided a solar battery including the wavelength conversion device of the eighth aspect disposed between a plurality of components of the solar battery or on a light incident surface thereof.

The luminescent substance particle and the luminescent substance particle production method of the present invention are capable of increasing the wavelength shift amount, improving the transparency, improving the internal quantum efficiency, improving the power generation efficiency of the solar battery or the like, and reducing the production cost.

The luminescent substance film, the wavelength conversion film, and the wavelength conversion device of the present invention are capable of increasing the wavelength shift amount, improving the transparency, improving the power generation efficiency of the solar battery or the like, and reducing the production cost.

The solar battery of the present invention uses the luminescent substance particle, the wavelength conversion film, or the wavelength conversion device, and thereby can exhibit an improved power generation efficiency. In addition, in the solar battery, the position of the wavelength conversion film or a component having a wavelength conversion function can be arbitrarily selected, and thus the design flexibility can be improved.

DESCRIPTION OF THE PREFERRED EMBODIMENTS

Several embodiments of a luminescent substance particle and a production method of the luminescent substance particle will be described below with reference to FIGS. 1 to 12. It should be noted that, in this description, a numeric range of "A to B" includes both the numeric values A and B as the lower limit and upper limit values.
(Luminescent Substance Particle)

A luminescent substance particle according to a first embodiment (hereinafter referred to as the first luminescent substance particle) has $BaSnO_3$:Zn having a perovskite-type structure, and contains more than 0.0% by mass and less than 8.0% by mass of Zn (zinc). Therefore, the first luminescent substance particle can exhibit an internal quantum efficiency of more than 50%, and thus can act to improve a power generation efficiency of a solar battery or the like and to reduce a production cost.

The Zn content is preferably not less than 0.005% by mass and not more than 3.000% by mass, and more preferably not less than 0.01% by mass and not more than 1.30% by mass.

A luminescent substance particle according to a second embodiment (hereinafter referred to as the second luminescent substance particle) has $BaSnO_3$:Mg having a perovskite-type structure, and contains more than 0.0% by mass and less than 0.1% by mass of Mg (magnesium). Therefore, the second luminescent substance particle can exhibit an internal quantum efficiency of more than 50%, and thus can act to improve a power generation efficiency of a solar battery or the like and to reduce a production cost.

The Mg content is preferably not less than 0.0005% by mass and not more than 0.0300% by mass, and more preferably not less than 0.001% by mass and not more than 0.010% by mass.

Figure 1:
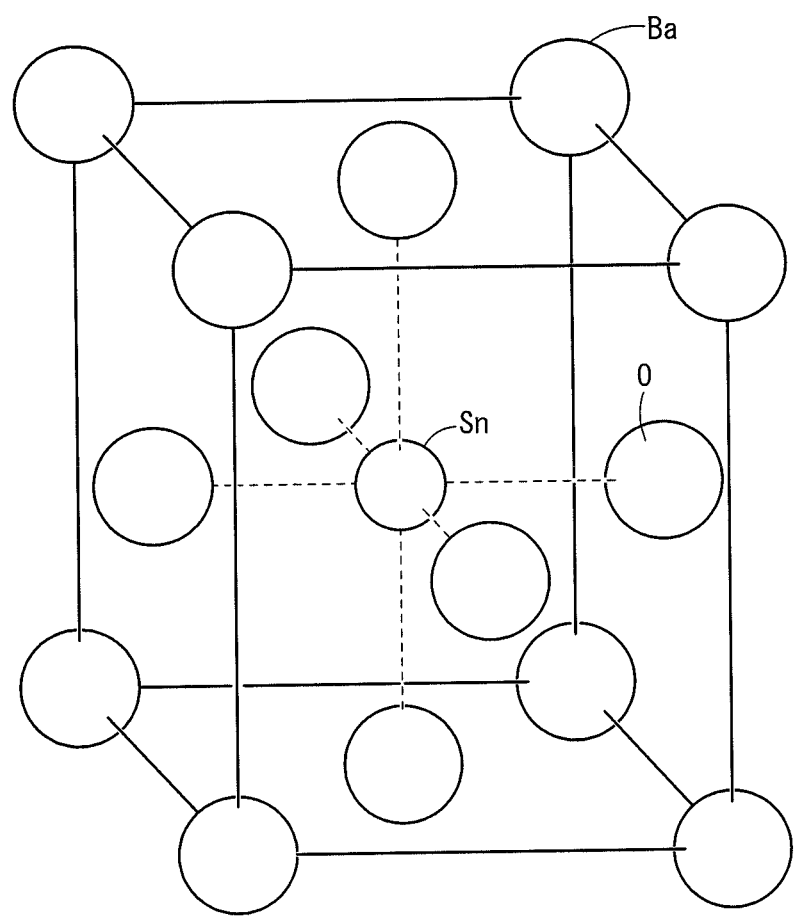
FIG. 1 is a view for illustrating a crystal structure of luminescent substance particles produced by methods for a luminescent substance particle according to first and second embodiments of the present invention.

The luminescent substance particles have a perovskite-type crystal structure shown in FIG. 1. In the crystal structure, the Ba (barium) atoms are located at the corner positions, the Sn (stannum) atom is located at the body center position, and the O (oxygen) atoms are located at the face center positions around the body center Sn. Zn or Mg may be incorporated into the perovskite-type crystal structure at either a substitutional site or interstitial site.

A method for producing the first and second luminescent substance particles contains the step of carrying out a reaction of a Ba (barium) source and a Sn (stannum) source.

In production of the first luminescent substance particle, it is preferred that the amounts of Ba, Sn, and Zn are controlled in such a manner that the amounts of Sn and Ba are equivalent to each other by mole and the amount of Zn is more than 0.000% by mole and less than 40.262% by mole per 100% by mole of Sn in the Sn source. The Zn amount is more preferably not less than 0.025% by mole and not more than 15.098% by mole, further preferably not less than 0.050% by mole and not more than 6.543% by mole, per 100% by mole of Sn in the Sn source.

In production of the second luminescent substance particle, it is preferred that the amounts of Ba, Sn, and Mg are controlled in such a manner that the amounts of Sn and Ba are equivalent to each other by mole and the amount of Mg is more than 0.000% by mole and less than 1.198% by mole per 100% by mole of Sn in the Sn source. The Mg amount is more preferably not less than 0.006% by mole and not more than 0.359% by mole, further preferably not less than 0.012% by mole and not more than 0.120% by mole, per 100% by mole of Sn in the Sn source.

In the method for producing the first and second luminescent substance particles, for example, a plasma synthesis process, a microwave hydrothermal synthesis process, a supercritical hydrothermal synthesis process using a titanium alloy container, a spray pyrolysis synthesis process, or the like may be performed in the step of carrying out the reaction.

In the plasma synthesis process, a $BaCO_3$ powder is used as the Ba source, and a $SnO_2$ powder is used as the Sn source, in such a manner that the amount of Sn is equivalent to the amount of Ba by mole. The sources and ethanol are added into an agate mortar, and the sources are ground and mixed until the mixture loses fluidity due to evaporation of the ethanol. Then, the resultant is dried by a dryer or the like to thereby obtain a mixture powder as a starting material for the plasma synthesis. The mixture powder is introduced into a plasma chamber at a high temperature to thereby produce a $BaSnO_3$ particle powder.

In the microwave hydrothermal synthesis process, $Ba(OH)_2$ is used as the Ba source, and a $SnO_2$ sol is used as the Sn source. The sources and an appropriate amount of water are added together with a stirrer chip made of TEFLON (trademark) into a pressure-resistant resin container having an inner coating of TEFLON (trademark), and the container is sealed. The inside of the container is heated to 270° C. by irradiating with a microwave at a maximum output of 600 W while stirring the mixture liquid in the container. The mixture liquid is maintained in the hydrothermal state for at least 10 hours to thereby obtain an aqueous solution containing $BaSnO_3$ particles dispersed. The aqueous solution is subjected to a centrifugation treatment, the supernatant is removed, pure water is added to the resultant, and this is subjected to the centrifugation treatment again. The water addition and the centrifugation treatment are repeated, and the resultant is dried by a dryer to thereby obtain a $BaSnO_3$ particle powder. The Ba source and the Sn source are not limited to the above compounds, and may be selected from chlorides, nitric acid compounds, and the like.

In the supercritical hydrothermal synthesis process using the titanium alloy container, $Ba(OH)_2$ is used as the Ba source, and a $SnO_2$ sol is used as the Sn source. The sources and an appropriate amount of water are added into a pressure-resistant container made of a titanium alloy, and the container is sealed. The mixture is heated to 400° C. by a dryer or the like, and is maintained in the supercritical hydrothermal state for at least 1 hour, to thereby obtain an aqueous solution containing $BaSnO_3$ particles dispersed. The aqueous solution is subjected to a centrifugation treatment, the supernatant is removed, pure water is added to the resultant, and this is subjected to the centrifugation treatment again. The water addition and the centrifugation treatment are repeated, and the resultant is dried by a dryer to thereby obtain a $BaSnO_3$ particle powder. The Ba source and the Sn source are not limited to the above compounds, and may be selected from chlorides, nitric acid compounds, and the like.

In the spray pyrolysis synthesis process, $BaCl_2$ is used as the Ba source, and $SnCl_2$ is used as the Sn source, in such a manner that the amount of Sn is equivalent to the amount of Ba by mole. The sources are dissolved in water to prepare an aqueous solution of a starting material. The aqueous solution is sprayed and introduced into a reaction container at a high temperature to thereby produce a $BaSnO_3$ particle powder. The Ba source and the Sn source are not limited to the above compounds, and may be selected from hydroxides, nitric acid compounds, and the like.

In the spray pyrolysis synthesis process, a salt-assisted spray pyrolysis synthesis may be carried out. The salt-assisted spray pyrolysis synthesis is characterized by the following steps. An inorganic compound of an element other than the elements for the target material particle is dissolved in a solution containing the sources, and this solution is subjected to the spray pyrolysis to thereby prepare an agglomerated particle. The structure of the agglomerated particle is such that a primary particle containing the elements for the target material is located inside the inorganic compound. Then, the inorganic compound is separated from the agglomerated particle to thereby produce the primary particle.

The composition of the luminescent substance particle may be measured by an energy dispersive X-ray analyzer. The crystal structure of the luminescent substance particle may be measured by a powder X-ray diffractometer (XRD). The particle diameter of the luminescent substance particle may be measured by observation using an electron microscope such as a transmission electron microscope (TEM).

In this embodiment, the particle diameter of the luminescent substance particle is preferably 100 nm or less although it may be of the order of micrometers.

The particle diameter of the luminescent substance particle may be measured by observation using an electron microscope such as a transmission electron microscope (TEM). The particle diameter of the luminescent substance particle is the diameter of the particle that is not subjected to a secondary treatment such as a grinding treatment or a classification treatment. The average particle diameter may be the average of the particle diameters of the luminescent substance particles contained in the observation area of the electron microscope.

(Luminescent Substance Film)

Figure 2:
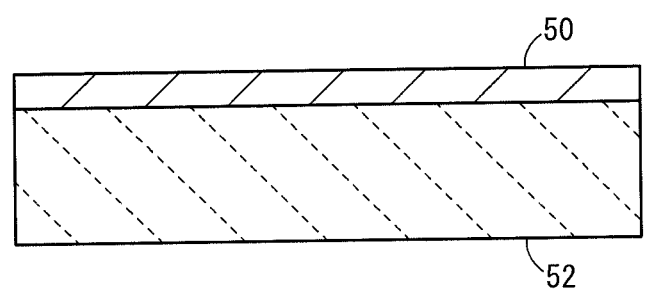
FIG. 2 is a cross-sectional view of a luminescent substance film according to an embodiment of the present invention formed on a substrate.

A luminescent substance film 50 shown in FIG. 2 according to an embodiment of the present invention contains the above described luminescent substance particle of the embodiment. The method for forming the luminescent substance film 50 is not particularly limited and may be appropriately selected depending on the intended use, as long as the luminescent substance film 50 contains the luminescent substance particle of the above embodiment. For example, the luminescent substance film 50 may be produced by a common method such as a spray method or a dipping method. In FIG. 2, the luminescent substance film 50 is formed on a substrate 52.

(Wavelength Conversion Film)

Figure 3:
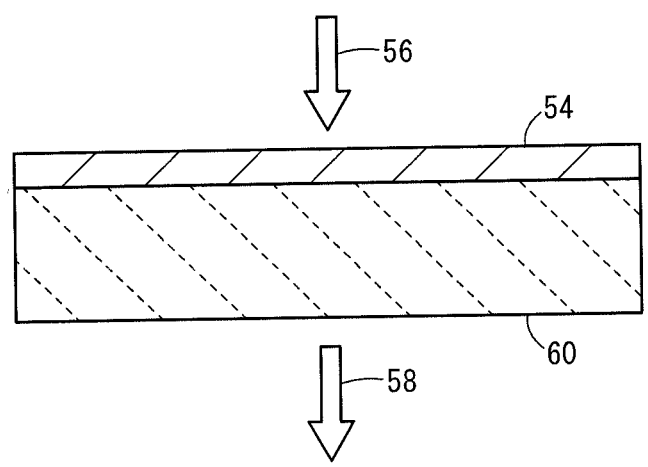
FIG. 3 is a cross-sectional view of a wavelength conversion film according to an embodiment of the present invention formed on a quartz glass.

As shown in FIG. 3, a wavelength conversion film 54 according to an embodiment of the present invention contains the above described luminescent substance particle of the embodiment, and acts to convert a light 56 in the ultraviolet region to a light 58 in the infrared region. The wavelength conversion film 54 is formed, e.g., on a surface of a quartz glass 60.

The wavelength conversion film 54 may be produced as follows. Thus, the luminescent substance particles are dispersed in a liquid phase, and application of the dispersion is performed to thereby produce the wavelength conversion film 54.

Figure 4:
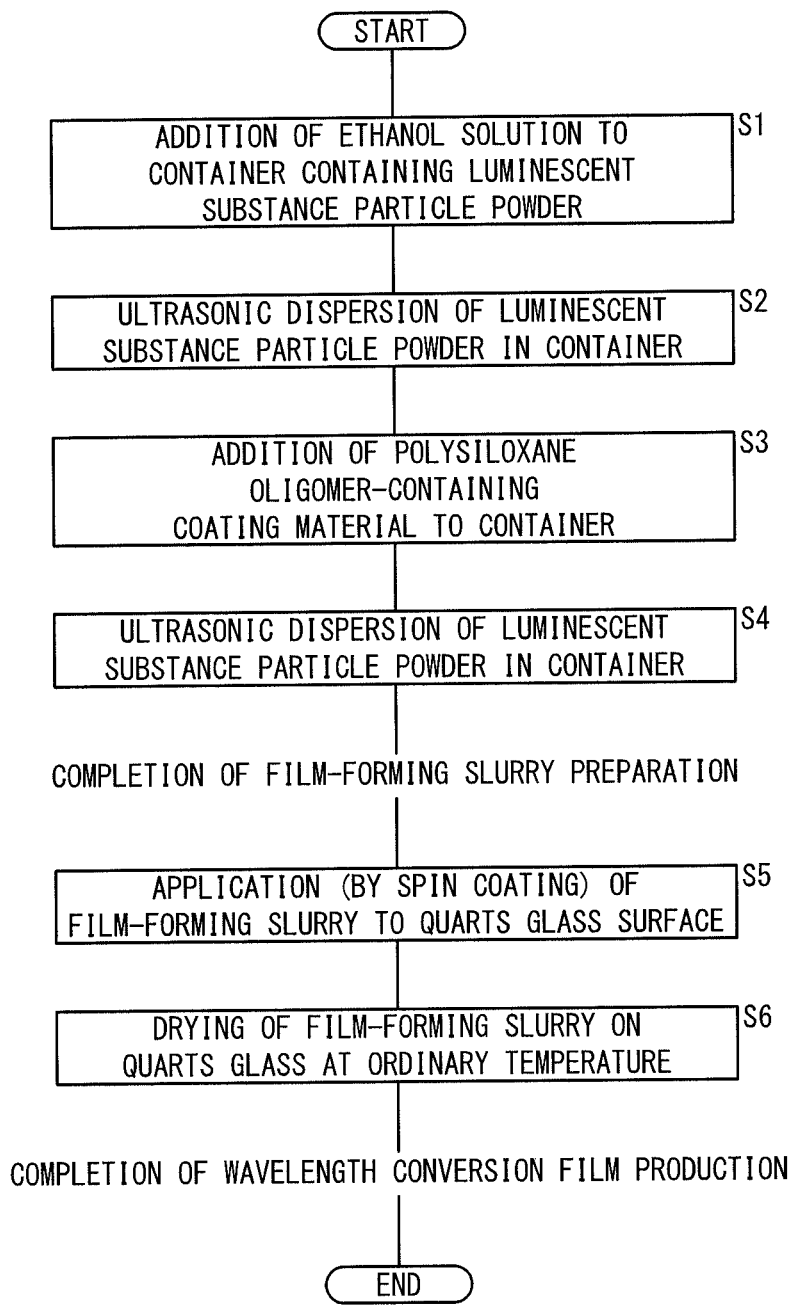
FIG. 4 is a flow chart of an example of a method for producing the wavelength conversion film.

More specifically, in Step S1 of FIG. 4, an ethanol solution is added into a container containing a powder of the luminescent substance particle. In Step S2, the luminescent substance particle powder in the container is ultrasonic-dispersed.

Then, in Step S3, a polysiloxane oligomer-containing coating material, such as GLASCA HP7003 (trade name) available from JSR Corporation, is added to the container. The polysiloxane oligomer-containing coating material is a solution containing a polysiloxane oligomer derived from an alkoxysilane. The solution is applied and dried to thereby form a strong transparent coating having a main skeleton of a siloxane bond network structure —$(Si—O)_n$—.

In Step S4, the luminescent substance particle powder in the container is ultrasonic-dispersed to prepare a film-forming slurry. In Step S5, the film-forming slurry is applied to the surface of the quartz glass 60 or the like. For example, the surface is spin-coated with the film-forming slurry.

In Step S6, the film-forming slurry applied to the quartz glass 60 is dried at ordinary temperature. By such drying, the liquid phase is hardened while incorporating the luminescent substance particle therein. Consequently, a strong wavelength conversion film 54 thus-obtained has the main skeleton of the siloxane bond network structure —$(Si—O)_n$— as described above.

(Wavelength Conversion Device)

Figure 5:
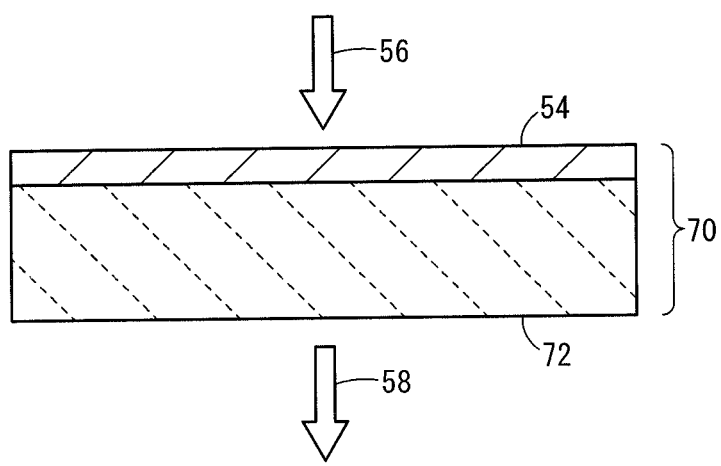
FIG. 5 is a cross-sectional view of a wavelength conversion device according to an embodiment of the present invention.

As shown in FIG. 5, a wavelength conversion device 70 according to an embodiment of the present invention has a substrate 72, and further has the above-described wavelength conversion film 54 formed on one main surface of the substrate 72. As the substrate 72, the above quartz glass 60, a soda glass for a solar battery, etc. may be used.

Alternatively, for example, as the substrate 72, a flexible transparent resin sheet, a composite sheet containing a resin and an inorganic material, or the like may be used. In this case, the substrate 72 is preferably a transparent film.

(Solar Battery)

Figure 6:
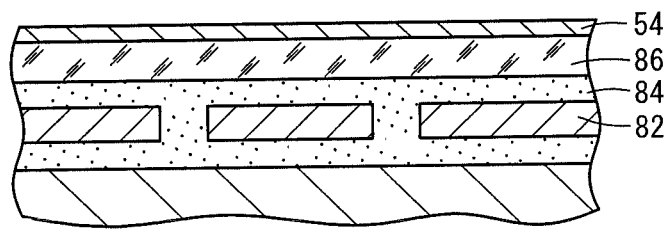
FIG. 6 is a cross-sectional view of a main portion of a solar battery according to an embodiment of the present invention.

As shown in FIG. 6, a main portion of a solar battery 80 according to an embodiment of the present invention has a plurality of power generation cells 82 arranged in a plane, a sealing layer 84 formed so as to cover the power generation cells 82, a glass 86 formed on the sealing layer 84, and the wavelength conversion film 54 formed on a front surface of the glass 86.

For example, the sealing layer 84 may be composed of a light-transmitting sealant resin such as a polyethylene-polyvinyl acetate copolymer (EVA). The sealing layer 84 preferably has a light transmittance of 80% or more in a wavelength region of 200 to 800 nm. The glass 86 is a protection glass, and generally uses a soda glass.

In another example of the solar battery 80 (not shown), the wavelength conversion film 54 may be formed on a front surface or a rear surface of at least one component of the solar battery 80. Alternatively, the wavelength conversion device 70 may be disposed between a plurality of components of the solar battery 80 or on a light incident surface of the solar battery 80.

In general, the wavelength conversion film 54 or the wavelength conversion device 70 may be located between the power generation cells 82 and the solar light incident surface. Incidentally, the glass 86 (the protection glass, generally containing the soda glass) and the sealing layer (containing a resin such as EVA) absorb a part of an ultraviolet light. Therefore, it is more preferred that the wavelength conversion film 54 is arranged closer to the solar light incident surface.

As described above, in Japanese Laid-Open Patent Publication No. 2013-004806, the wavelength conversion layer contains an organic material. Thus, the document gives a suggestion that it is not preferable to form the wavelength conversion layer on the outermost surface exposed to external air. In this embodiment, since the wavelength conversion film 54 is composed of the inorganic material, the wavelength conversion film 54 can be disposed on the outermost surface. Thus, in the present invention, the formation position of the wavelength conversion film 54 or the wavelength conversion device 70 can be arbitrarily selected, and the design flexibility can be increased. In this regard, in Japanese Laid-Open Patent Publication No. 2013-004806, an ultraviolet-transmittable quartz glass is used as a protection glass. However, the quartz glass is highly costly, and therefore cannot be actually used in a solar battery.

EXAMPLES

First Example

XRD patterns of luminescent substance particles of Samples 1 to 16 were evaluated. Furthermore, light emission intensities of the luminescent substance particles of Samples 1 to 16 were evaluated in the fluorescence spectra. Each fluorescence spectrum was obtained by emitting lights with various excitation wavelengths to the luminescent substance particle thereof. Furthermore, effects of Zn or Mg addition on internal quantum efficiency were evaluated.

(Sample 1)

A $BaCO_3$ powder (BAH07XB available from Kojundo Chemical Lab. Co., Ltd.) was used as a Ba source, and a $SnO_2$ powder (SNO06PB available from Kojundo Chemical Lab. Co., Ltd.) was used as a Sn source. The Ba source and the Sn source were reacted by a plasma synthesis process to thereby produce the luminescent substance particle of Sample 1. In the production of the luminescent substance particle of Sample 1, 0.010% by mole of Zn was added to 100% by mole of Sn in the Sn source. The Zn cation addition was carried out in the plasma synthesis process as follows. $Zn(NO_3)_2 \cdot 6H_2O$ (ZNH09XAG available from Kojundo Chemical Lab. Co., Ltd.) was added to and dissolved in ethanol, and the $BaCO_3$ powder and the $SnO_2$ powder were ground and mixed in the ethanol solution as described above, while the Zn amount per 100% by mole of Sn in the Sn source is controlled to be a specified mole ratio.

(Sample 2)

The luminescent substance particle of Sample 2 was produced in the same manner as Sample 1 except that 0.020% by mole of Zn was added to 100% by mole of Sn in the Sn source.

(Sample 3)

The luminescent substance particle of Sample 3 was produced in the same manner as Sample 1 except that 0.040% by mole of Zn was added to 100% by mole of Sn in the Sn source.

(Sample 4)

The luminescent substance particle of Sample 4 was produced in the same manner as Sample 1 except that 0.200% by mole of Zn was added to 100% by mole of Sn in the Sn source.

(Sample 5)

The luminescent substance particle of Sample 5 was produced in the same manner as Sample 1 except that 1.000% by mole of Zn was added to 100% by mole of Sn in the Sn source.

(Sample 6)

The luminescent substance particle of Sample 6 was produced in the same manner as Sample 1 except that 4.000% by mole of Zn was added to 100% by mole of Sn in the Sn source.

(Sample 7)

The luminescent substance particle of Sample 7 was produced in the same manner as Sample 1 except that 20.000% by mole of Zn was added to 100% by mole of Sn in the Sn source.

(Sample 8)

The luminescent substance particle of Sample 8 was produced in the same manner as Sample 1 except that 40.000% by mole of Zn was added to 100% by mole of Sn in the Sn source.

(Sample 9)

A Ba source and a Sn source were reacted by a plasma synthesis process to thereby produce the luminescent substance particle of Sample 9. In the production of the luminescent substance particle of Sample 9, 0.002% by mole of Mg was added to 100% by mole of Sn in the Sn source. The Mg cation addition was carried out in the plasma synthesis process as follows. $Mg(NO_3)_2 \cdot 6H_2O$ (MGH12XB available from Kojundo Chemical Lab. Co., Ltd.) was added to and dissolved in ethanol, and the $BaCO_3$ powder and the $SnO_2$ powder were ground and mixed in the ethanol solution as described above, while the Mg amount per 100% by mole of Sn in the Sn source is controlled to be a specified mole ratio.

(Sample 10)

The luminescent substance particle of Sample 10 was produced in the same manner as Sample 9 except that 0.005% by mole of Mg was added to 100% by mole of Sn in the Sn source.

(Sample 11)

The luminescent substance particle of Sample 11 was produced in the same manner as Sample 9 except that 0.010% by mole of Mg was added to 100% by mole of Sn in the Sn source.

(Sample 12)

The luminescent substance particle of Sample 12 was produced in the same manner as Sample 9 except that 0.040% by mole of Mg was added to 100% by mole of Sn in the Sn source.

(Sample 13)

The luminescent substance particle of Sample 13 was produced in the same manner as Sample 9 except that 0.064% by mole of Mg was added to 100% by mole of Sn in the Sn source.

(Sample 14)

The luminescent substance particle of Sample 14 was produced in the same manner as Sample 9 except that 0.200% by mole of Mg was added to 100% by mole of Sn in the Sn source.

(Sample 15)

The luminescent substance particle of Sample 15 was produced in the same manner as Sample 9 except that 0.500% by mole of Mg was added to 100% by mole of Sn in the Sn source.

(Sample 16)

The luminescent substance particle of Sample 16 was produced in the same manner as Sample 9 except that 3.000% by mole of Mg was added to 100% by mole of Sn in the Sn source.

The details, the Zn and Mg contents, and the internal quantum efficiencies of Samples 1 to 16 are shown in Tables 1 and 2.

TABLE 1

| | Added Zn amount per 100% by mole of Sn in Sn source (% by mole) | Zn content (% by mass) | Internal quantum efficiency (%) |
|---|---|---|---|
| Sample 1 | 0.010 | 0.002 | 52 |
| Sample 2 | 0.020 | 0.004 | 54 |
| Sample 3 | 0.040 | 0.008 | 59 |
| Sample 4 | 0.200 | 0.030 | 65 |
| Sample 5 | 1.000 | 0.180 | 66 |
| Sample 6 | 4.000 | 0.800 | 62 |
| Sample 7 | 20.000 | 4.230 | 53 |
| Sample 8 | 40.000 | 8.050 | 49 |

TABLE 2

| | Added Mg amount per 100% by mole of Sn in Sn source (% by mole) | Mg content (% by mass) | Internal quantum efficiency (%) |
|---|---|---|---|
| Sample 9 | 0.002 | 0.0002 | 51 |
| Sample 10 | 0.005 | 0.0004 | 53 |
| Sample 11 | 0.010 | 0.0010 | 59 |
| Sample 12 | 0.040 | 0.0020 | 62 |
| Sample 13 | 0.064 | 0.0060 | 61 |
| Sample 14 | 0.200 | 0.0150 | 58 |
| Sample 15 | 0.500 | 0.0460 | 52 |
| Sample 16 | 3.000 | 0.2500 | 49 |

<Evaluation: XRD Pattern and TEM Microstructure>

(Sample 1)

Figure 7A:
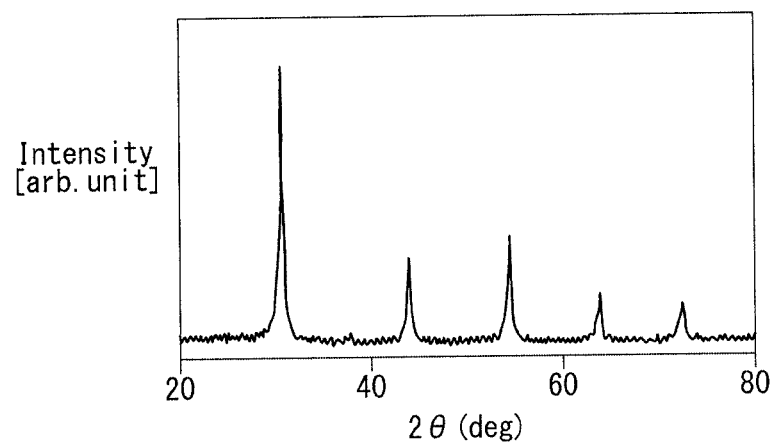
FIG. 7A is an XRD pattern of a luminescent substance particle of Sample 1.
Figure 7B:
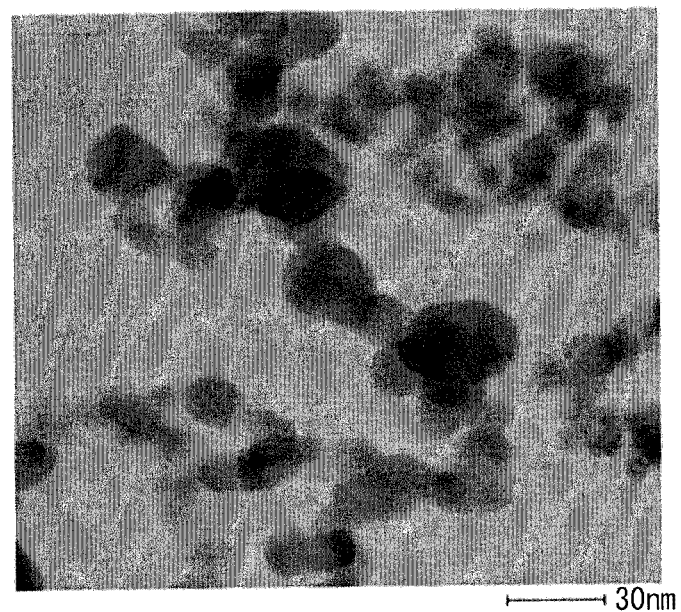
FIG. 7B is a photograph of a microstructure of the luminescent substance particle of Sample 1 taken by a TEM (transmission electron microscope) (hereinafter referred to simply as the TEM microstructure)

A typical XRD pattern of the luminescent substance particle of Sample 1 is shown in FIG. 7A. The XRD pattern is approximately equal to that of the cubic crystal $BaSnO_3$. A TEM microstructure of the luminescent substance particle of Sample 1 is shown in FIG. 7B. As evident from FIG. 7B, it was confirmed that the luminescent substance particles having particle diameters of about 10 to 40 nm were formed.

(Samples 2 to 16)

XRD patterns and TEM microstructures of Samples 2 to 16 were similar to those of Sample 1 (FIGS. 7A and 7B).

<Evaluation: Zn Content>

Figure 8A:
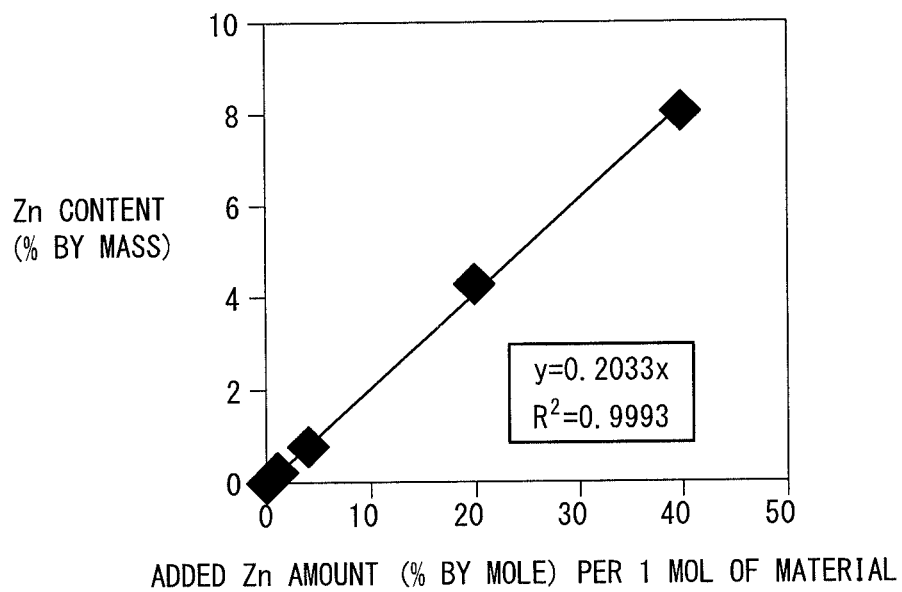
FIG. 8A is a graph showing results of Samples 4 to 8, the x-axis representing added Zn amount (% by mole) per 1 mol of material, and the y-axis representing Zn content (% by mass)

The Zn contents of Samples 1 to 3 were lower than the detection limit of the FP method using fluorescent X-ray spectra. Therefore, the Zn contents were estimated as follows. As shown in FIG. 8A, the data of Samples 4 to 8 were plotted on an x-y graph. The x-axis represents added Zn amount (% by mole) per 1 mol of Sn in the Sn source, and the y-axis represents Zn content (% by mass). A line equation (y=0.2033x, $R^2$=0.9993) was obtained from the plotted data by a least-square method, and the Zn contents corresponding to the added Zn amounts of Samples 1 to 3 were determined using the line equation ($R^2$: coefficient of determination that indicates the "goodness of fit" of the line equation for the data of Samples 4 to 8).

(Samples 1 to 3)

The Zn contents of Samples 1, 2, and 3 determined based on the above line equation were 0.002%, 0.004%, and 0.008% by mass, respectively.

(Sample 4)

Concerning the Zn content of Sample 4, a non-standard semi-quantitative analysis of the obtained fluorescent X-ray spectrum was carried out based on an FP method. As a result, the Zn content of Sample 4 was 0.030% by mass.

(Samples 5 to 8)

Samples 5, 6, 7, and 8 had Zn contents of 0.180%, 0.800%, 4.230%, and 8.050% by mass respectively.

<Evaluation: Mg Content>

Figure 8B:
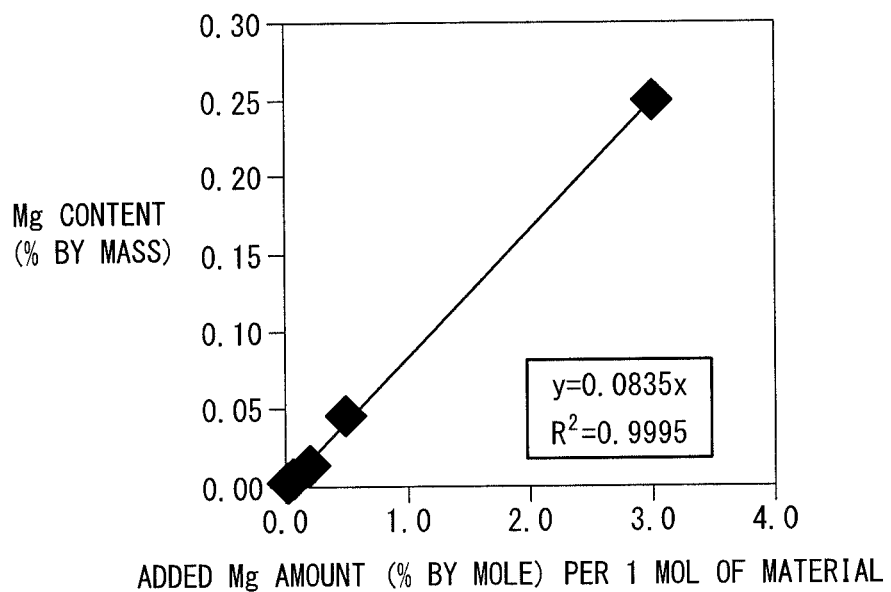
FIG. 8B is a graph showing results of Samples 11 to 16, the x-axis representing added Mg amount (% by mole) per 1 mol of material, and the y-axis representing Mg content (% by mass)

Similarly to the Zn contents of Samples 1 and 2, the Mg contents of Samples 9 and 10 were lower than the detection limit of the FP method using fluorescent X-ray spectra. Therefore, the Mg contents were estimated as follows. As shown in FIG. 8B, the data of Samples 11 to 16 were plotted on an x-y graph. The x-axis represents added Mg amount (% by mole) per 1 mol of Sn in the Sn source, and the y-axis represents Mg content (% by mass). A line equation (y=0.0835x, $R^2$=0.9995) was obtained from the plotted data by a least-square method, and the Mg contents corresponding to the added Mg amounts of Samples 9 and 10 were determined using the line equation ($R^2$: coefficient of determination that indicates the "goodness of fit" of the line equation for the data of Samples 11 to 16).

(Samples 9 and 10)

The Mg contents of Samples 9 and 10 determined based on the above line equation were 0.0002% and 0.0004% by mass respectively.

(Sample 11)

Concerning the Mg content of Sample 11, a non-standard semi-quantitative analysis of the obtained fluorescent X-ray spectrum was carried out based on an FP method. As a result, Sample 11 had a Mg content of 0.0010% by mass.

(Samples 12 to 16)

Samples 12, 13, 14, 15, and 16 had Mg contents of 0.0020%, 0.0060%, 0.0150%, 0.0460%, and 0.2500% by mass respectively.

<Evaluation: Internal Quantum Efficiency>

(Sample 1)

An internal quantum efficiency of a specimen of the luminescent substance particle of Sample 1 (a specimen of Sample 1) was measured by using a spectrofluorophotometer (FP-8600 available from JASCO Corporation) and a ϕ60-mm integrating sphere. In the internal quantum efficiency measurement, the specimen of Sample 1 was irradiated with an excitation light having a wavelength of 360 nm.

Figure 9:
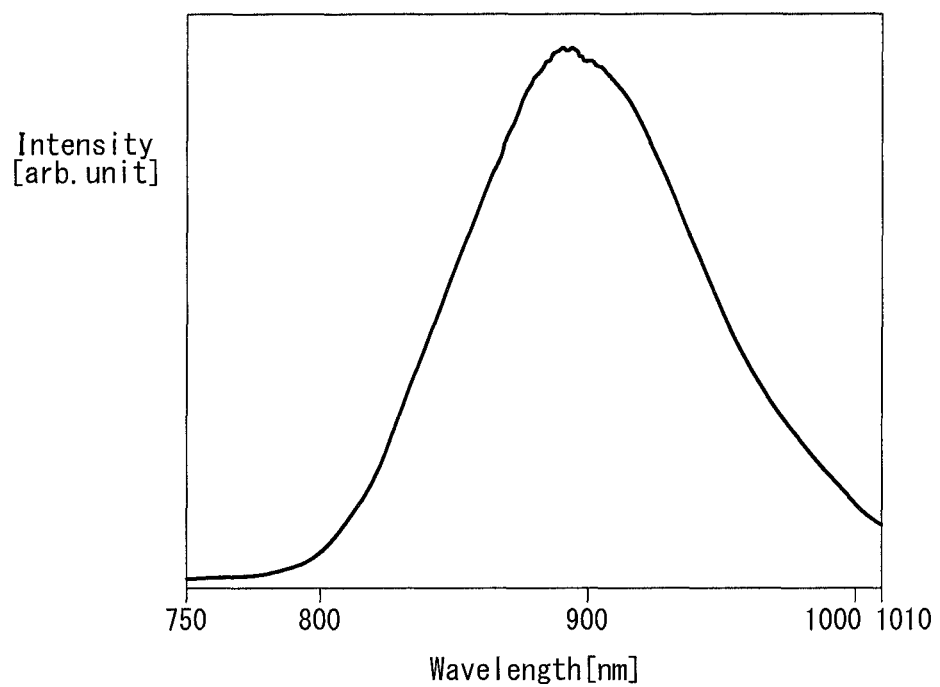
FIG. 9 is a fluorescence spectrum of the luminescent substance particle of Sample 1.

As shown in FIG. 9, in the internal quantum efficiency measurement, a fluorescence spectrum peak with a center wavelength of approximately 900 nm was observed under the excitation light having the wavelength of 360 nm. The following Samples 2 to 16 exhibited a similar peak.

As a result of the measurement, the specimen of Sample 1 had an internal quantum efficiency of 52%.

(Samples 2 to 8)

The internal quantum efficiencies of the luminescent substance particle specimens of Samples 2 to 8 were measured in the same manner as Sample 1. As a result, as shown in Table 1, Samples 2 to 8 had internal quantum efficiencies of 54%, 59%, 65%, 66%, 62%, 53%, 49%, respectively.

(Samples 9 to 16)

The internal quantum efficiencies of the luminescent substance particle specimens of Samples 9 to 16 were measured in the same manner as Sample 1. As a result, as shown in Table 2, Samples 9 to 16 had internal quantum efficiencies of 51%, 53%, 59%, 62%, 61%, 58%, 52%, 49%, respectively.

<Evaluation: Internal Quantum Efficiency With Respect to Zn Content>

Figure 10:
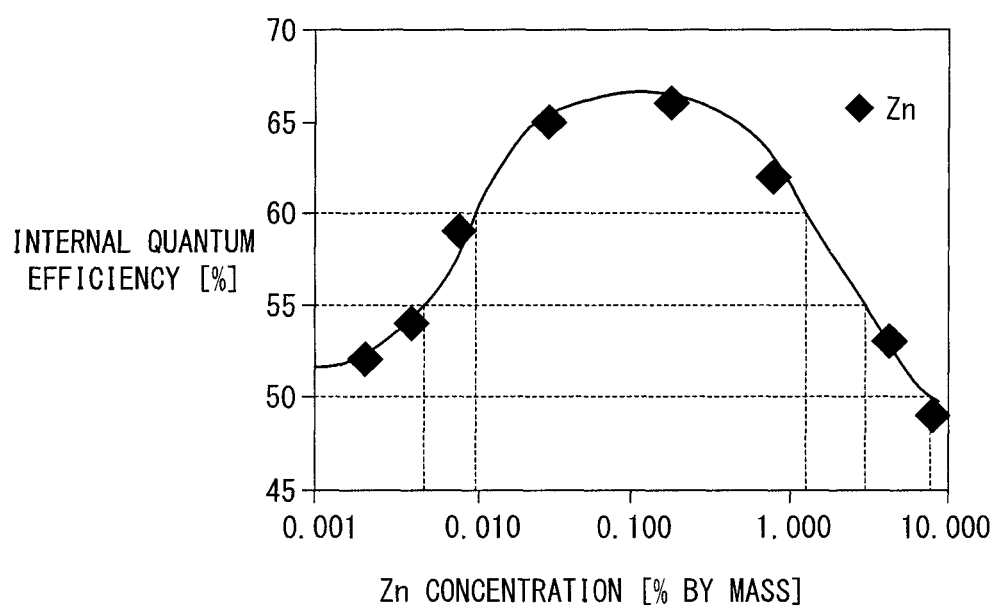
FIG. 10 is a graph showing change of internal quantum efficiency with respect to Zn concentration (Zn content)

Based on the results of Samples 1 to 8, the internal quantum efficiencies were plotted with respect to the Zn concentrations (Zn contents) to thereby obtain a characteristic curve representing the internal quantum efficiency changes with respect to the Zn concentration. The results are shown in FIG. 10.

The characteristic curve shows the following properties. The internal quantum efficiency was about 50% when the Zn concentration was 0% by mass. The internal quantum efficiency was increased as the Zn concentration was increased, and the internal quantum efficiency had a peak of about 66% when the Zn concentration was about 0.1% by mass. The internal quantum efficiency was lowered as the Zn concentration was further increased, and the internal quantum efficiency was below 50% when the Zn concentration was 8.00% by mass.

As is clear from the results, it is preferred that the Zn content falls within the range shown in Table 3.

TABLE 3

| | | Range | | |
| --- | --- | --- | --- | --- |
| | | P1 | P2 | P3 |
| Internal quantum efficiency | | >50% | ≥55% | ≥60% |
| Zn concentration | Lower limit | More than 0 | 0.005 | 0.010 |
| (% by mass) | Upper limit | Less than 8.000 | 3.000 | 1.300 |

Thus, when the Zn concentration is within the range P1 of more than 0% by mass and less than 8.000% by mass, the internal quantum efficiency is more than 50%. When the Zn concentration is within the range P2 of not less than 0.005% by mass and not more than 3.000% by mass, the internal quantum efficiency is 55% or more. When the Zn concentration is within the range P3 of not less than 0.010% by mass and not more than 1.300% by mass, the internal quantum efficiency is 60% or more.

Furthermore, the added Zn amounts (feed mole ratios) corresponding to the three threshold values of the Zn concentration were determined using the line equation (y=0.2033x, $R^2$=0.9993) shown in FIG. 8A. The results are shown in Table 4.

TABLE 4

| | | Range | | |
| --- | --- | --- | --- | --- |
| | | P1 | P2 | P3 |
| Internal quantum efficiency | | >50% | ≥55% | ≥60% |
| Added Zn amount | Lower limit | More than 0 | 0.025 | 0.050 |
| (% by mole) | Upper limit | Less than 40.262 | 15.098 | 6.543 |

<Evaluation: Internal Quantum Efficiency With Respect to Mg Content>

Figure 11:
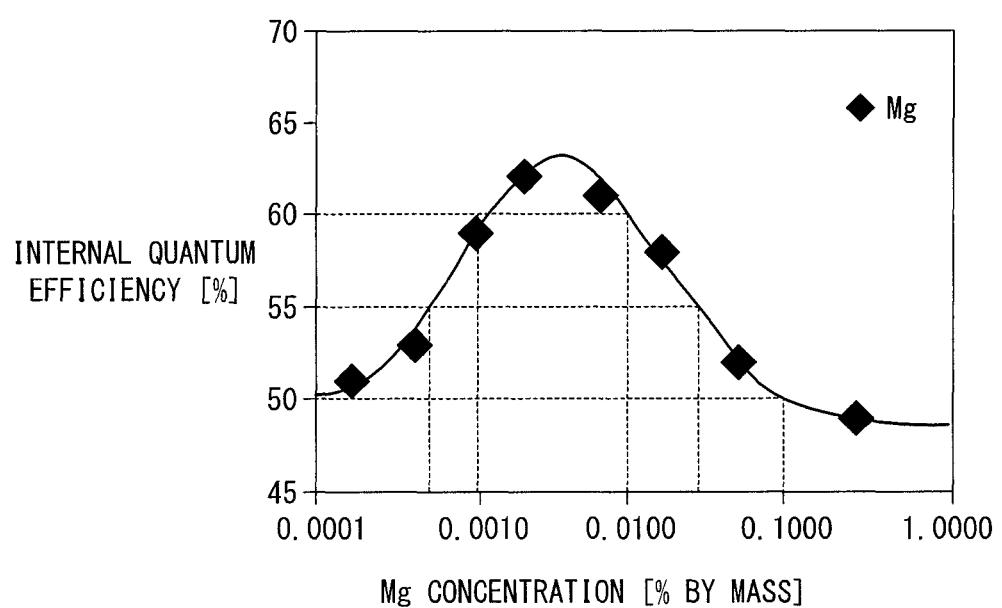
FIG. 11 is a graph showing change of internal quantum efficiency with respect to Mg concentration (Mg content)

Based on the results of Samples 9 to 16, the internal quantum efficiencies were plotted with respect to the Mg concentrations (Mg contents) to thereby obtain a characteristic curve representing the internal quantum efficiency changes with respect to the Mg concentration. The results are shown in FIG. 11.

The characteristic curve shows the following properties. The internal quantum efficiency was about 50% when the Mg concentration was 0% by mass. The internal quantum efficiency was increased as the Mg concentration was increased, and the internal quantum efficiency had a peak of about 63% when the Mg concentration was about 0.0035% by mass. The internal quantum efficiency was lowered as the Mg concentration was further increased, and the internal quantum efficiency was below 50% when the Mg concentration was about 0.1% by mass.

As is clear from the results, it is preferred that the Mg concentration is within the range shown in Table 5.

TABLE 5

| | | Range | | |
| --- | --- | --- | --- | --- |
| | | P4 | P5 | P6 |
| Internal quantum efficiency | | >50% | ≥55% | ≥60% |
| Mg concentration | Lower limit | More than 0 | 0.0005 | 0.0010 |
| (% by mass) | Upper limit | Less than 0.1000 | 0.0300 | 0.0100 |

Thus, when the Mg concentration is within the range P4 of more than 0% by mass and less than 0.1000% by mass, the internal quantum efficiency is more than 50%. When the Mg concentration is within the range P5 of not less than 0.0005% by mass and not more than 0.0300% by mass, the internal quantum efficiency is 55% or more. When the Mg concentration is within the range P6 of not less than 0.0010% by mass and not more than 0.0100% by mass, the internal quantum efficiency is 60% or more.

Furthermore, the added Mg amounts (feed mole ratios) corresponding to the three threshold values of the Mg concentration were determined using the line equation (y=0.0835x, $R^2$=0.9995) shown in FIG. 8B. The results are shown in Table 6.

TABLE 6

| | | Range | | |
| --- | --- | --- | --- | --- |
| | | P4 | P5 | P6 |
| Internal quantum efficiency | | >50% | ≥55% | ≥60% |
| Added Mg amount | Lower limit | More than 0 | 0.006 | 0.012 |
| (% by mole) | Upper limit | Less than 1.198 | 0.359 | 0.120 |

Second Example

Solar Battery

Electric power generation amount differences were confirmed between Examples 1 to 10 and Comparative Examples 1 and 2. Furthermore, electric power generation amount increases with respect to Comparative Example 1 were confirmed in Examples 1 to 10 and Comparative Example 2.

Example 1

A solar battery of Example 1 had the same structure as the solar battery 80 shown in FIG. 6. More specifically, the solar battery of Example 1 has a plurality of the power generation cells 82 arranged in a plane, the sealing layer 84 formed so as to cover the power generation cells 82, the glass 86 formed on the sealing layer 84, and the wavelength conversion film 54 formed on a surface of the glass 86. The luminescent substance particle contained in the wavelength conversion film 54 was prepared as follows. A Ba source and a Sn source were reacted by a plasma synthesis process, 0.040% by mole of Zn being added to 100% by mole of Sn in the Sn source in the same manner as Sample 3. The luminescent substance particle had a Zn content of 0.008% by mass (estimate value).

Example 2

A solar battery of Example 2 was produced in the same manner as Example 1 except that the luminescent substance particle in the wavelength conversion film 54 was prepared by adding 1.000% by mole of Zn to 100% by mole of Sn in the Sn source as in Sample 5. The luminescent substance particle had a Zn content of 0.180% by mass.

Example 3

A solar battery of Example 3 was produced in the same manner as Example 1 except that the luminescent substance particle in the wavelength conversion film 54 was prepared by adding 0.040% by mole of Mg to 100% by mole of Sn in the Sn source as in Sample 12. The luminescent substance particle had a Mg content of 0.0020% by mass.

Example 4

A solar battery of Example 4 was produced in the same manner as Example 1 except that the luminescent substance particle in the wavelength conversion film 54 was prepared by adding 0.200% by mole of Mg to 100% by mole of Sn in the Sn source as in Sample 14. The luminescent substance particle had a Mg content of 0.0150% by mass.

Examples 5 and 6

Solar batteries of Examples 5 and 6 were produced in the same manner as Examples 2 and 3 respectively except that the luminescent substance particle in the wavelength conversion film 54 was prepared as follows. A Ba source and a Sn source were reacted by a microwave hydrothermal synthesis process, wherein in Example 5, 1.000% by mole of Zn was added to 100% by mole of Sn in the Sn source, and in Example 6, 0.040% by mole of Mg was added to 100% by mole of Sn in the Sn source.

Examples 7 and 8

Solar batteries of Examples 7 and 8 were produced in the same manner as Examples 2 and 3 respectively except that the luminescent substance particle in the wavelength conversion film 54 was prepared as follows. A Ba source and a Sn source were reacted by a supercritical hydrothermal synthesis process using a titanium alloy container, wherein in Example 7, 1.000% by mole of Zn was added to 100% by mole of Sn in the Sn source, and in Example 8, 0.040% by mole of Mg was added to 100% by mole of Sn in the Sn source.

Examples 9 and 10

Solar batteries of Examples 9 and 10 were produced in the same manner as Examples 2 and 3 respectively except that the luminescent substance particle in the wavelength conversion film 54 was prepared as follows. A Ba source and a Sn source were reacted by a spray pyrolysis synthesis process, wherein in Example 9, 1.000% by mole of Zn was added to 100% by mole of Sn in the Sn source, and in Example 10, 0.040% by mole of Mg was added to 100% by mole of Sn in the Sn source.

Comparative Example 1

Figure 12:
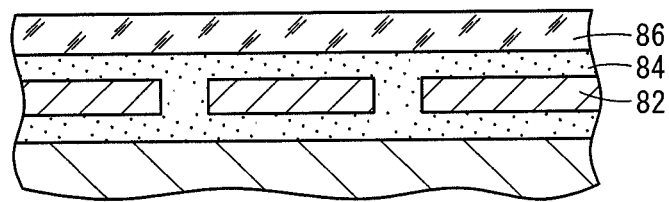
FIG. 12 is a cross-sectional view of a main portion of a solar battery according to Comparative Example 1.

As shown in FIG. 12, a solar battery of Comparative Example 1 has a plurality of the power generation cells 82 arranged in a plane, the sealing layer 84 formed on the power generation cells 82, and the glass 86 formed on the sealing layer 84.

Comparative Example 2

A solar battery of Comparative Example 2 was produced in the same manner as Example 1 except that the luminescent substance particle in the wavelength conversion film 54 was prepared without adding Zn or Mg.

(Evaluation)

The details and the power generation amounts (mW/cm$^2$) of Examples 1 to 10 and Comparative Examples 1 and 2 are shown in Table 7. Furthermore, the output increases (%) of Examples 1 to 10 and Comparative Example 2 are shown in Table 7. For example, the output increase of Example 1 was calculated by the equation: (power generation amount of Example 1−power generation amount of Comparative Example 1)/power generation amount of Comparative Example 1.

TABLE 7

| | Luminescent substance particle production method | Additive element | Added element amount per 100% by mole of Sn in Sn source (% by mole) | Internal quantum efficiency (%) | Power generation amount (mW/cm$^2$) | Output increase (%) |
|---|---|---|---|---|---|---|
| Comp. Ex. 1 | No luminescent substance particle No wavelength conversion film | | | | 12.20 | 0 |
| Comp. Ex. 2 | Plasma | Not added | — | 50 | 13.30 | 9.0 |
| Ex. 1 | Plasma | Zn | 0.040 | 59 | 13.60 | 11.5 |
| Ex. 2 | Plasma | Zn | 1.000 | 66 | 13.80 | 13.1 |
| Ex. 3 | Plasma | Mg | 0.040 | 62 | 13.70 | 12.3 |

TABLE 7-continued

| | Luminescent substance particle production method | Additive element | Added element amount per 100% by mole of Sn in Sn source (% by mole) | Internal quantum efficiency (%) | Power generation amount (mW/cm$^2$) | Output increase (%) |
|---|---|---|---|---|---|---|
| Ex. 4 | Plasma | Mg | 0.200 | 58 | 13.55 | 11.1 |
| Ex. 5 | Microwave hydrothermal | Zn | 1.000 | 65 | 13.75 | 12.7 |
| Ex. 6 | Microwave hydrothermal | Mg | 0.040 | 61 | 13.60 | 11.5 |
| Ex. 7 | Supercritical hydrothermal | Zn | 1.000 | 65 | 13.70 | 12.3 |
| Ex. 8 | Supercritical hydrothermal | Mg | 0.040 | 61 | 13.60 | 11.5 |
| Ex. 9 | Spray pyrolysis | Zn | 1.000 | 66 | 13.75 | 12.7 |
| Ex. 10 | Spray pyrolysis | Mg | 0.040 | 62 | 13.65 | 11.9 |

The power generation amounts of Comparative Examples 1 contrast, the power generation amounts of Examples 1 to 10 were larger than those of Comparative Examples 1 and 2. In particular, the solar batteries of Examples 2, 3, and 5 to 10 had internal quantum efficiencies of more than 60% and thus exhibited excellent output increases.

As is also clear from the results of Examples 2, 3, and 5 to 10, for producing the luminescent substance particle, the supercritical hydrothermal synthesis process using the titanium alloy container was preferred, the microwave hydrothermal synthesis process was more preferred, the spray pyrolysis synthesis process was further preferred, and the plasma synthesis process was most preferred.

The luminescent substance particle, the luminescent substance particle production method, the luminescent substance film, the wavelength conversion film, the wavelength conversion device, and the solar battery of the present invention are not limited to the above-described embodiments, and various changes and modifications may be made therein without departing from the scope of the invention.

What is claimed is:

1. A luminescent substance particle comprising BaSnO$_3$:Mg having a perovskite-type structure, wherein a content of Mg (magnesium) is more than 0.0% by mass and less than 0.1% by mass, and
wherein the luminescent substance particle has a particle diameter of 100 nm or less.

2. The luminescent substance particle according to claim 1, wherein the luminescent substance particle exhibits an internal quantum efficiency of more than 50%.

3. A method for producing the luminescent substance particle according to claim 1, comprising a reaction step of carrying out a reaction of a Ba (barium) source, a Sn (stannum) source, and a Mg (magnesium) source to obtain the luminescent substance particle,
wherein
amounts of Ba, Sn, and Mg are controlled in a manner that the amounts of Sn and Ba are equivalent to each other by mole, and the amount of Mg is more than 0.000% by mole and less than 1.198% by mole per 100% by mole of Sn in the Sn source.

4. A luminescent substance film comprising the luminescent substance particle according to claim 1.

5. A wavelength conversion film for converting a light in an ultraviolet region to a light in an infrared region, comprising a luminescent substance particle comprising BaSnO$_3$:Mg having a perovskite-type structure, wherein a content of Mg (magnesium) is more than 0.0% by mass and less than 0.1% by mass.

6. A wavelength conversion device comprising:
a substrate; and
the wavelength conversion film according to claim 5 formed on the substrate.

7. The wavelength conversion device according to claim 6, wherein the substrate is a flexible resin sheet or a composite sheet containing a resin and an inorganic material.

* * * * *